(12) United States Patent
Tang et al.

(10) Patent No.: US 11,121,467 B2
(45) Date of Patent: Sep. 14, 2021

(54) SEMICONDUCTOR PACKAGE WITH COMPACT ANTENNA FORMED USING THREE-DIMENSIONAL ADDITIVE MANUFACTURING PROCESS

(71) Applicant: NXP USA, Inc., Austin, TX (US)

(72) Inventors: Jinbang Tang, Chandler, AZ (US); Zhiwei Gong, Chandler, AZ (US); Betty Hill-Shan Yeung, Chandler, AZ (US); Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 52 days.

(21) Appl. No.: 16/450,064

(22) Filed: Jun. 24, 2019

(65) Prior Publication Data

US 2020/0403314 A1 Dec. 24, 2020

(51) Int. Cl.
| | |
|---|---|
| *H01Q 9/04* | (2006.01) |
| *H01Q 9/40* | (2006.01) |
| *H01Q 1/22* | (2006.01) |
| *H01Q 1/38* | (2006.01) |
| *H01Q 13/10* | (2006.01) |
| *H01Q 21/06* | (2006.01) |
| *H01L 23/66* | (2006.01) |
| *H01L 21/56* | (2006.01) |
| *H01L 25/16* | (2006.01) |

(52) U.S. Cl.
CPC ......... *H01Q 9/0407* (2013.01); *H01L 21/56* (2013.01); *H01L 23/66* (2013.01); *H01L 25/165* (2013.01); *H01Q 1/2283* (2013.01); *H01Q 1/38* (2013.01); *H01Q 9/40* (2013.01); *H01Q 13/10* (2013.01); *H01Q 21/065* (2013.01); *H01L 2223/6677* (2013.01)

(58) Field of Classification Search
CPC ........ H01Q 9/0407; H01Q 9/40; H01Q 13/10; H01Q 21/065; H01Q 1/2283; H01Q 1/38; H01L 21/56; H01L 23/66; H01L 25/165; H01L 2223/6677
See application file for complete search history.

(56) References Cited

U.S. PATENT DOCUMENTS

| | | |
|---|---|---|
| 5,869,905 A | 2/1999 | Takebe |
| 6,258,632 B1 | 7/2001 | Takebe |
| 6,770,959 B2 | 8/2004 | Huang et al. |

(Continued)

OTHER PUBLICATIONS

Optomec, "The Technology Behind Aerosol Jet," https://www.optomec.com/printed-electronics/aerosol-jet-technology/. Downloaded from the internet Jun. 24, 2019.

(Continued)

*Primary Examiner* — Andrea Lindgren Baltzell
*Assistant Examiner* — Patrick R Holecek

(57) ABSTRACT

A semiconductor device package is provided that incorporates an antenna structure within the package through use of three-dimensional additive manufacturing processes. Embodiments can provide semiconductor device packages that are thinner than traditional device packages by depositing specific metal and dielectric layers within the package in desired positions with precision that cannot be provided by other manufacturing techniques. Further, embodiments can provide antenna geometries and orientations that cannot be provided by other manufacturing techniques.

16 Claims, 6 Drawing Sheets

(56) References Cited

U.S. PATENT DOCUMENTS

| | | | |
|---|---|---|---|
| 7,095,372 B2 | 8/2006 | Soler Castany et al. | |
| 7,768,457 B2 | 8/2010 | Pettus et al. | |
| 8,714,459 B2* | 5/2014 | McCormack | H01Q 9/26 |
| | | | 235/492 |
| 9,349,696 B2* | 5/2016 | Lachner | H01L 24/12 |
| 9,362,234 B2* | 6/2016 | Pabst | H01L 21/768 |
| 9,761,511 B2 | 9/2017 | Ziglioli | |
| 9,818,665 B2 | 11/2017 | Elian et al. | |
| 10,510,679 B2* | 12/2019 | Wang | H01L 21/6836 |
| 2019/0027804 A1* | 1/2019 | Kim, II | H01Q 21/0025 |

OTHER PUBLICATIONS

Hester et al., "From the Integrated Circuit to the Integrated System: the Additive Manufacturing revolution," Georgia Institute of Technology, Presentation to NXP, Phoenix, Arizona, Jul. 27, 2018, 57 pages.

* cited by examiner

SEMICONDUCTOR PACKAGE WITH COMPACT ANTENNA FORMED USING THREE-DIMENSIONAL ADDITIVE MANUFACTURING PROCESS

BACKGROUND

Field

This disclosure relates generally to semiconductor packaging, and more specifically, to forming a package including an antenna structure using an additive manufacturing process.

Related Art

As the size of electronic components becomes smaller and smaller, and as the size of devices containing those electronic components also decreases, density demands for electronic chip packaging become greater and greater. Three-dimensional packaging has emerged as a solution for achieving the higher densities of components and necessitated by these small devices.

For small electronic devices incorporating radio functions (e.g., WiFi, 5G, Bluetooth, and the like), there are advantages to providing antennas for the radios in the electronic component packages themselves. This is especially true for high frequency radios, where connection distance between a device die that provides the radio functionality and the antenna is important. But traditional methods of providing three dimensional semiconductor device packages do not allow for flexibility in placement or orientation of antenna structures. This can result in device packages that are thicker than certain applications allow for, or which cannot be properly oriented for other applications.

It is therefore desirable to provide a semiconductor device package that includes a radio antenna, where the package has flexibility in location of the antenna in the package and the antenna's orientation to the geometry of the package.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Figure 1:
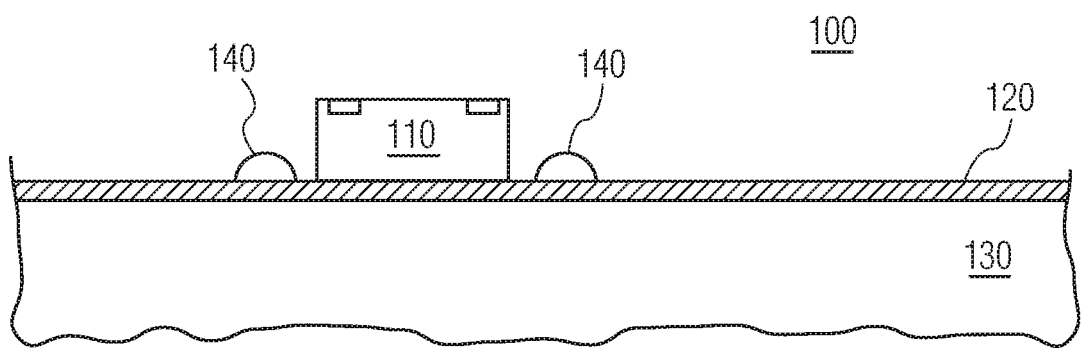
FIG. 1 is a simplified block diagram illustrating a cross-section view of a semiconductor device package structure at a stage in one example of processing, in accord with one embodiment of the present invention.

Embodiments of the present invention provide a semiconductor device package that incorporates an antenna structure within the package through use of three-dimensional additive manufacturing processes. Embodiments can provide semiconductor device packages that are thinner than traditional device packages by depositing specific metal and dielectric layers within the package in desired positions with precision that cannot be provided by other manufacturing techniques. Further, embodiments can provide antenna geometries and orientations that cannot be provided by other manufacturing techniques.

In order to provide multiple functionalities in a semiconductor device package, multiple semiconductor device die and other functional structures can be incorporated in the package. In order to provide the desired functionalities in a package consuming as little floorplan area as possible, the multiple semiconductor device die and other structures can be stacked one on top of the other. An example of a method for incorporating multiple semiconductor device die in a package is fan-out wafer-level packaging (FOWLP), which involves positioning semiconductor device die on a carrier wafer/panel, molding the device die and other structures, followed by forming a redistribution layer on top of the molded area, and then forming solder balls on an active surface of the device package. While decreasing the floor-plan area of the semiconductor device package, such a stacked configuration can also undesirably increase the height of the semiconductor device package once all the device die and other structures are encapsulated in the package. Further, there are limitations in the types of structures and materials that can be utilized in forming a semiconductor device package using traditional FOWLP methods.

In order to overcome issues related to materials, positioning, and structures within traditional semiconductor device packages, especially when incorporating antenna structures for radio applications, embodiments of the present invention utilize additive manufacturing techniques to form a semiconductor device package. Additive manufacturing (also known as 3D printing) builds up features of a part layer-by-layer from a geometry described in a three-dimensional design model. Additive manufacturing techniques can be used to form 3D interconnects, ultra-fine feature circuitry, and component and die attach structures, as well as perform component underfill and encapsulation. By using conductive inks in combination with base materials (e.g., dielectrics), additive manufacturing can be used to print 3D packages as a single, continuous part, effectively creating fully functional electronics that require little-to-no assembly. Materials that can be used for additive manufacturing can include, for example, thermoplastics, metals, ceramics, graphene, and nanomaterials that include silver or copper.

Embodiments of the present invention incorporate antenna structures into a semiconductor device package using additive manufacturing techniques to place a ground plane for an antenna in a more desirable location for certain applications than can be performed using traditional techniques. Embodiments can also place conductive traces from a semiconductor device die to the ground plane in order to minimize a signal distance to the ground plane. In addition, the additive manufacturing techniques can be used to form the antenna itself along with signal traces. Further, embodiments provide semiconductor device packages incorporating antennas in a thinner package than is possible using traditional packaging techniques. This is done by incorporating an antenna ground plane and dielectric within the thickness of a semiconductor device die encapsulated in the package, rather than placing the ground plane on a major surface of the package along with additional dielectric and metal for the antenna structure.

FIGS. 1-11 illustrate one example of steps involved in forming a semiconductor device package utilizing additive manufacturing techniques, in accord with one embodiment of the present invention.

FIG. 1 is a simplified block diagram illustrating a cross-section view of a semiconductor device package structure 100 at a stage in one example of processing, in accord with one embodiment of the present invention. Semiconductor device structure 100 includes a semiconductor device die 110 mounted on a printing inclusive carrier 120 that is attached to a process carrier 130. Printing inclusive carrier 120 can be an adhesive layer made of any type of adhesive material that can withstand packaging processing without separating from either semiconductor device die 110 or process carrier 130 (e.g., double-sided polyimide sticky tape having silicone adhesive on both sides, or other types of adhesive layers used in the art). As illustrated, semiconductor device die 110 is mounted with an active major surface (i.e., a surface of the semiconductor device die having signal pads) facing away from the printing inclusive carrier. Additionally, an anti-shift frame 140 is printed on printing inclusive carrier 120. Anti-shift frame 140 can be printed before or after semiconductor device die 110 is placed on the printing inclusive carrier. The anti-shift frame can be formed either of conductive or non-conductive substances, depending upon the application for the final semiconductor device package. In some cases, a conductive anti-shift frame can aid in controlling effects on the semiconductor device die due to electromagnetic radiation from an antenna structure incorporated in the semiconductor device package, as shown below.

Figure 2:
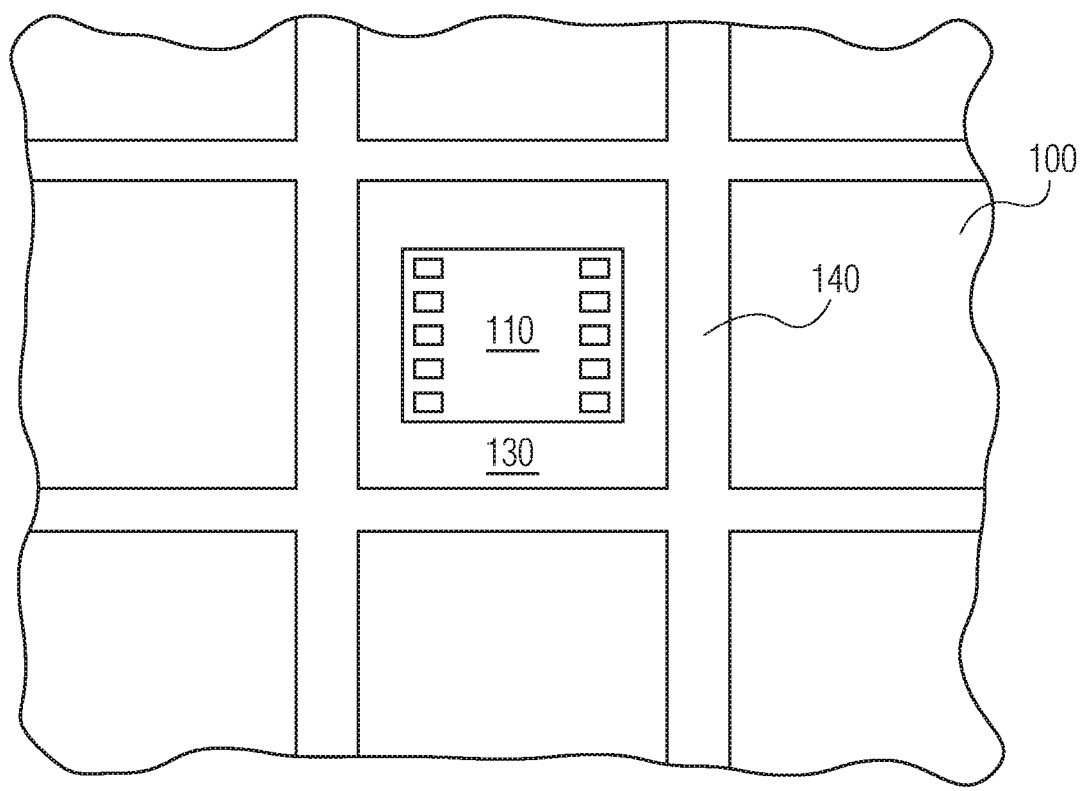
FIG. 2 is a simplified block diagram illustrating a plan view of the semiconductor device package structure at the stage of processing illustrated in FIG. 1.

FIG. 2 is a simplified block diagram illustrating a plan view of semiconductor device package structure 100 at the stage of processing illustrated in FIG. 1. As illustrated, anti-shift frame 140 provides a grid pattern within which semiconductor device die 110 can be placed in a repeated fashion for forming multiple semiconductor device packages at one time.

Figure 3:
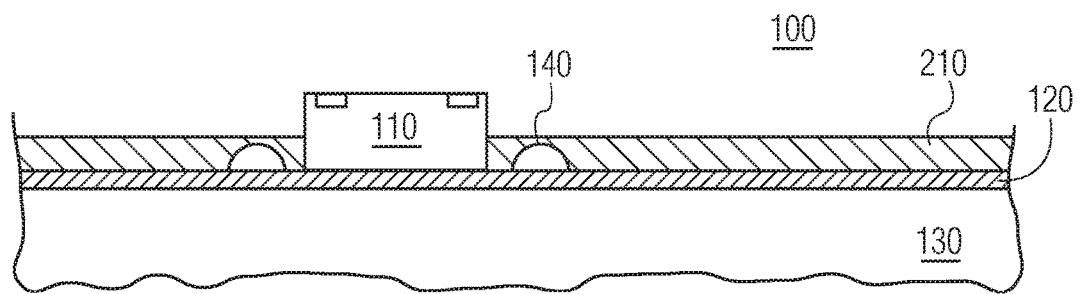
FIG. 3 is a simplified block diagram illustrating a cross-section view of the semiconductor device package structure at a stage in one example of processing subsequent to that of FIG. 1, according to one embodiment of the present invention.

FIG. 3 is a simplified block diagram illustrating a cross-section view of semiconductor device package structure 100 at a stage in one example of processing subsequent to that of FIG. 1, according to one embodiment of the present invention. A first dielectric layer 210 is formed over printing inclusive carrier 120 and anti-shift frame 140 to a desired thickness, using additive manufacturing techniques. As illustrated, first dielectric layer 210 is printed around and bordering semiconductor device die 110 to a thickness of about half the thickness of semiconductor device die 110. The formed thickness of first dielectric layer 210 is application dependent. Further, a thickness of first dielectric layer 210 can be varied in areas of the semiconductor device package, based on needs of the application. For example, a thickness of first dielectric layer 210 to the right of semiconductor device die 110 can be less than a thickness of first dielectric layer 210 to the left of semiconductor device die 110, if desired. First dielectric layer 210 can be any type of dielectric material compatible with additive manufacturing techniques and selected for the particular application, such as polyimide ink or other polymer solutions.

Figure 4:
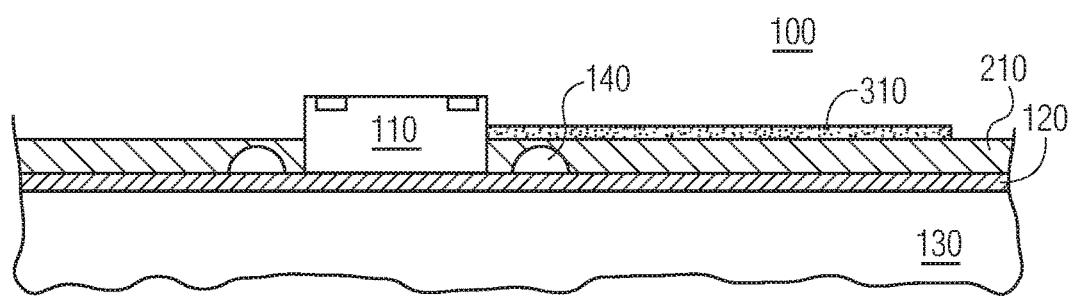
FIG. 4 is a simplified block diagram illustrating a cross-section view of the semiconductor device package structure at a stage in the example of processing subsequent to that of FIG. 3, according to one embodiment of the present invention.
Figure 5:
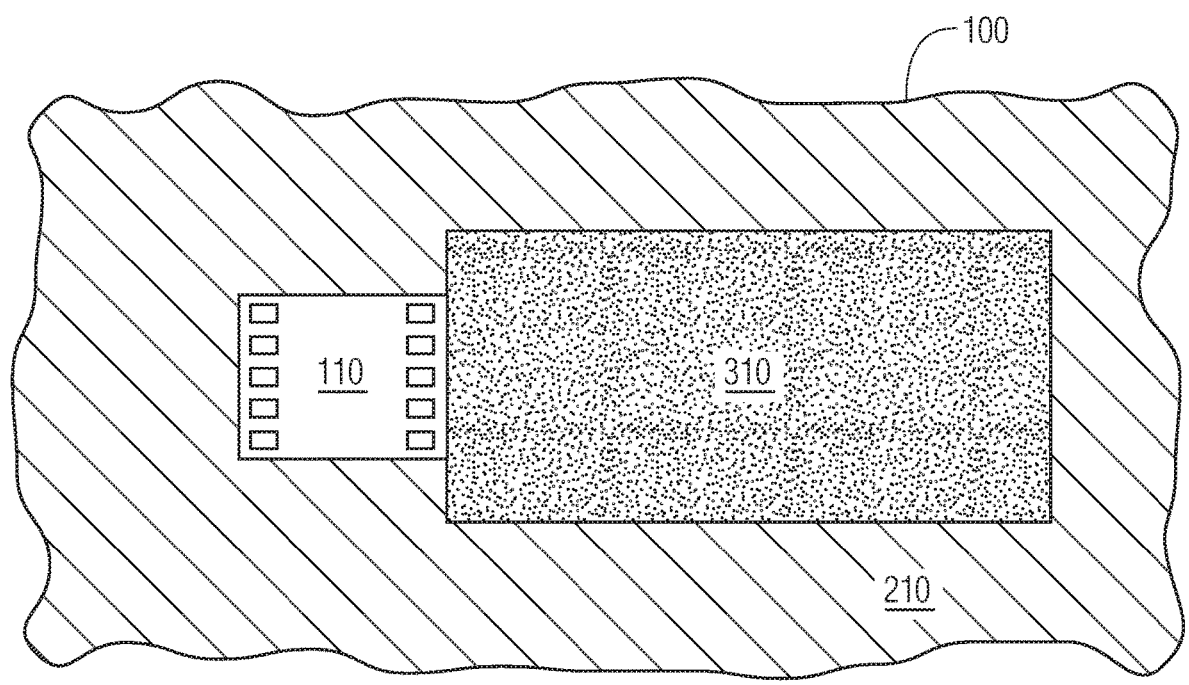
FIG. 5 is a simplified block diagram illustrating a plan view of the semiconductor device package structure at the same stage of processing as that illustrated in FIG. 4.

FIG. 4 is a simplified block diagram illustrating a cross-section view of semiconductor device package structure 100 at a stage in the example of processing subsequent to that of FIG. 3, according to one embodiment of the present invention. FIG. 5 is a simplified block diagram illustrating a plan view of semiconductor device package structure 100 at the same stage of processing as that illustrated in FIG. 4. A ground plane 310 is formed above first dielectric layer 210 using additive manufacturing techniques. Ground plane 310 is formed of a conductive material and of dimensions appropriate for the desired application of a patch antenna structure. Ground plane 310 can be constructed of conductive materials including, for example, metals, graphene, and conductive nanomaterials. Through the use of additive manufacturing techniques, ground plane 310 can be formed immediately adjacent to semiconductor device die 110, which reduces a signal path to the ground plane from the semiconductor device die. Further, as illustrated, ground plane 310 is formed within the dielectric material of semiconductor device package 100, thereby allowing for a thinner profile of the package. The dimensions and shape of ground plane 310 are dependent upon the application for the antenna structure. Embodiments of the present invention are not limited by any specific dimension or shape.

Figure 6:
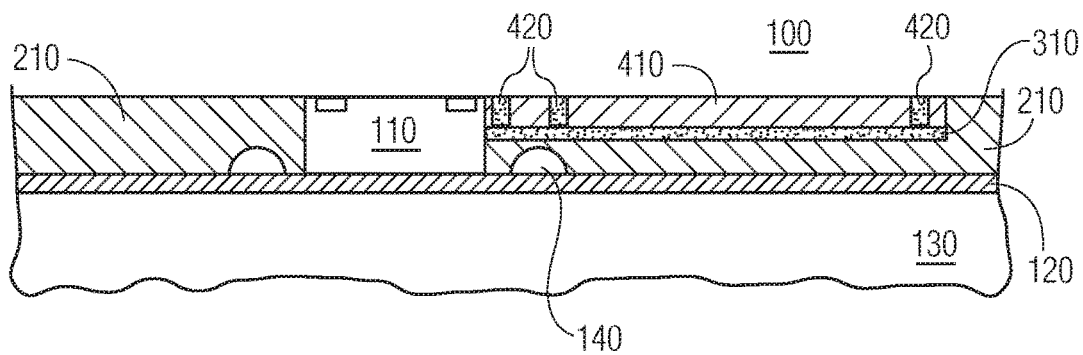
FIG. 6 is a simplified block diagram illustrating a cross-section view of the semiconductor device package structure at a stage in the example of processing subsequent to that of FIG. 4, according to one embodiment of the present invention.
Figure 7:
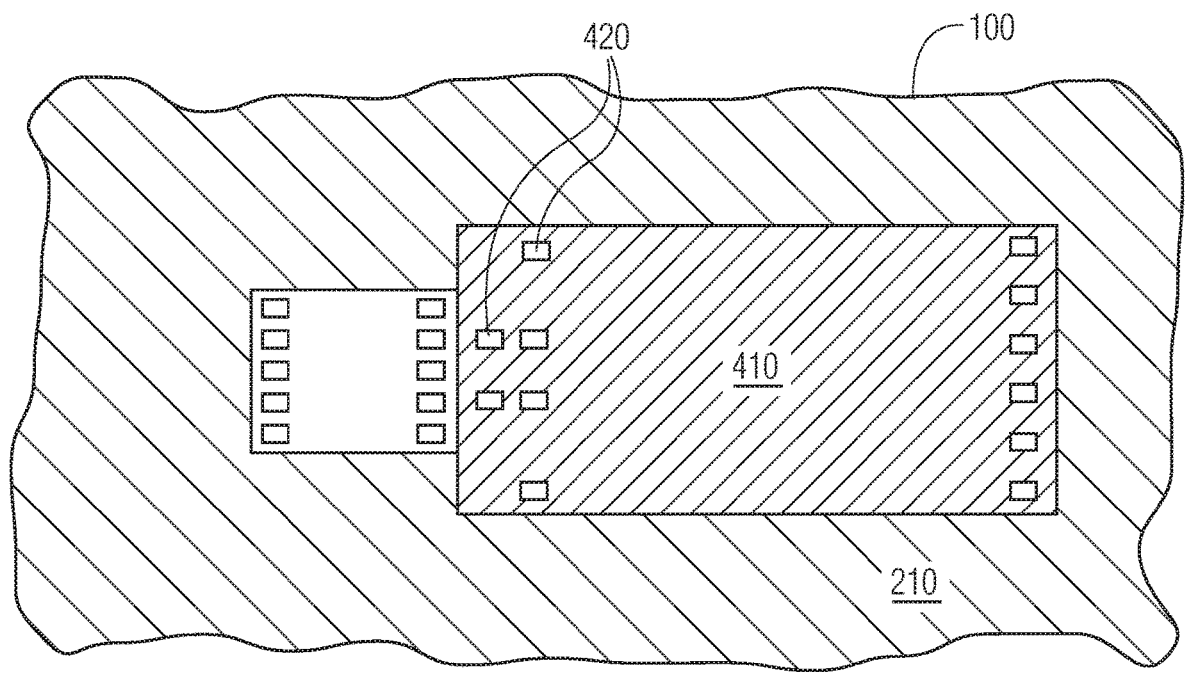
FIG. 7 is a simplified block diagram illustrating a plan view of the semiconductor device package structure at the same stage of processing as that illustrated in FIG. 6.

FIG. 6 is a simplified block diagram illustrating a cross-section view of semiconductor device package structure 100 at a stage in the example of processing subsequent to that of FIG. 4, according to one embodiment of the present invention. FIG. 7 is a simplified block diagram illustrating a plan view of semiconductor device package structure 100 at the same stage of processing as that illustrated in FIG. 6. Using additive manufacturing techniques, a second dielectric layer 410 is formed over and adjacent to ground plane 310 in the region directly above ground plane 310. In addition, first dielectric layer 210 is increased in depth in regions where second dielectric layer is absent. In addition, conductive vias 420 electrically coupled to ground plane 310 are formed in desired areas through the second dielectric layer.

Second dielectric layer 410 is formed in a region that will be between an antenna patch and ground plane 310, and thus affects performance of the antenna structure. It is therefore desirable that materials selected for second dielectric layer 410 be optimized for the particular antenna application. As an example, for applications using high frequencies (e.g., mmWave and 5G), a second dielectric layer having a low permittivity ($D_k$) and low loss tangent ($D_f$) is desirable. These characteristics can affect dimensions of the antenna structure. Further, a thickness of second dielectric layer 410 also affects performance of the finished antenna structure (e.g., bandwidth of the antenna).

Figure 8:
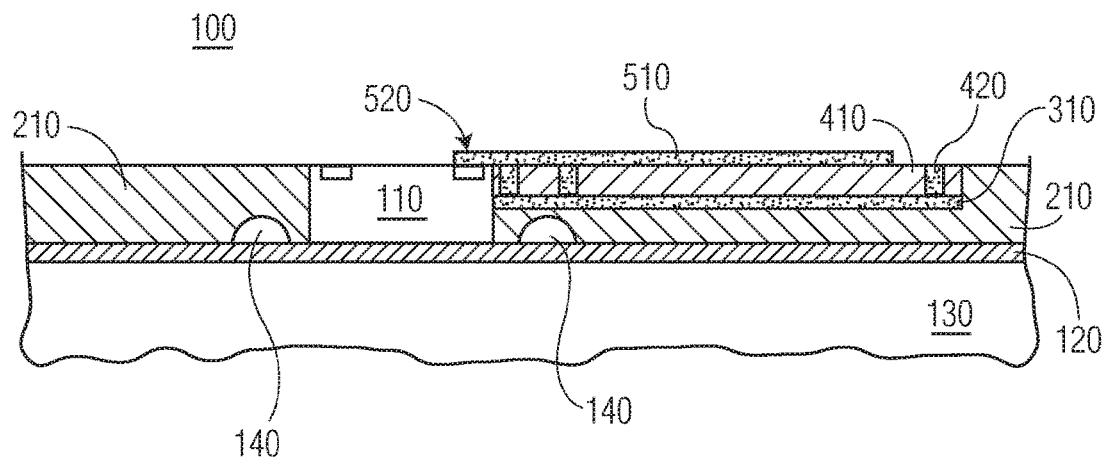
FIG. 8 is a simplified block diagram illustrating a cross-section view of the semiconductor device package structure at a stage in the example of processing subsequent to that of FIG. 6, according to one embodiment of the present invention.
Figure 9:
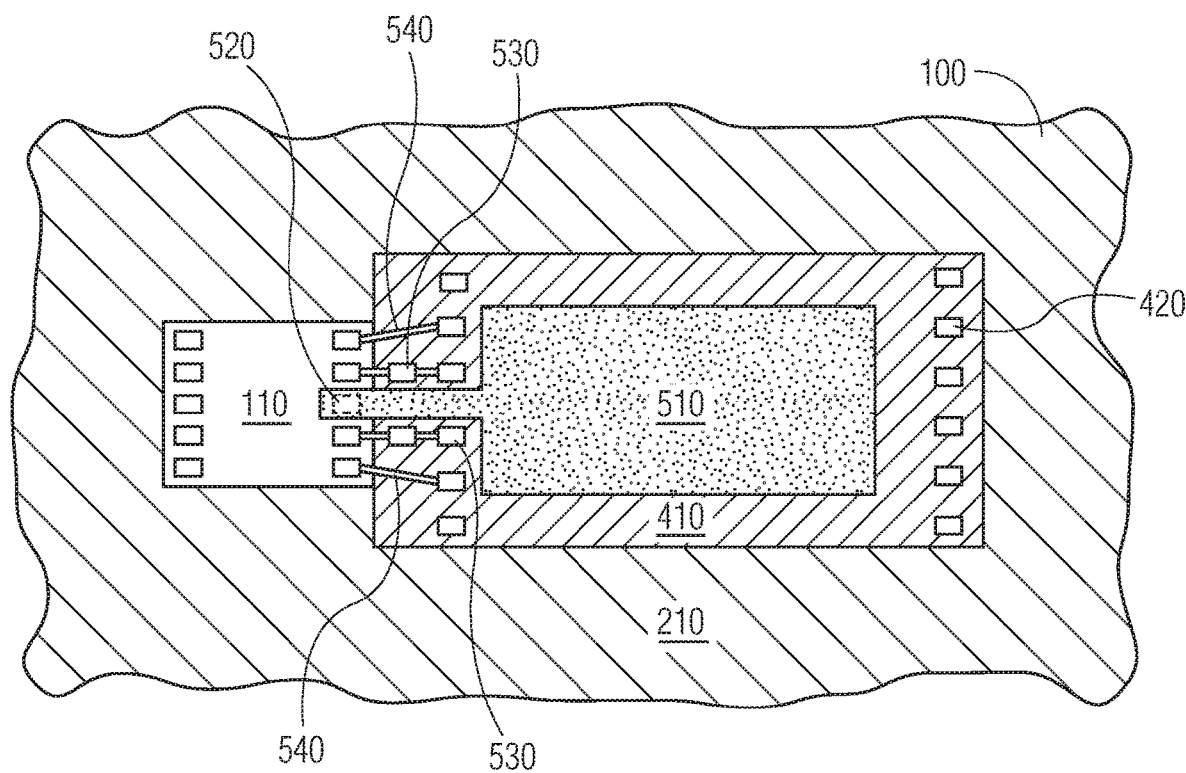
FIG. 9 is a simplified block diagram illustrating a plan view of the semiconductor device package structure at the same stage of processing as that of FIG. 8.

FIG. 8 is a simplified block diagram illustrating a cross-section view of semiconductor device package structure 100 at a stage in the example of processing subsequent to that of FIG. 6, according to one embodiment of the present invention. FIG. 9 is a simplified block diagram illustrating a plan view of semiconductor device package structure 100 at the same stage of processing as that of FIG. 8. An antenna patch 510 is formed using additive manufacturing techniques above and in contact with second dielectric layer 410. Antenna patch 510 is formed of a conductive material that can be the same as or different from the conductive material used to form ground plane 310. Dimensions of antenna patch 510 are dependent upon the nature of the application for the semiconductor device package, but commonly will be of less area than that of ground plane 310.

As illustrated, an extension 520 of antenna patch 510 is printed to engage with an appropriate signal pad on semiconductor device die 110. Extension 520 can be formed of the same conductive material as antenna patch 510. In addition, connection traces 530 are formed to electrically couple appropriate signal pads of semiconductor device die 110 to conductive vias extending through second dielectric layer 410 to ground plane 310. Using additive manufacturing techniques, placement of ground plane 310 and antenna patch 510 can be made close enough to semiconductor device die 110 to permit optimization of performance of the antenna structure for millimeter wave type applications (e.g., very short transitions). Additional traces 540 can be printed from signal pads on semiconductor device die 110 to other vias or formed pads on second dielectric layer 410 as part of the process of printing antenna patch 510.

Figure 10:
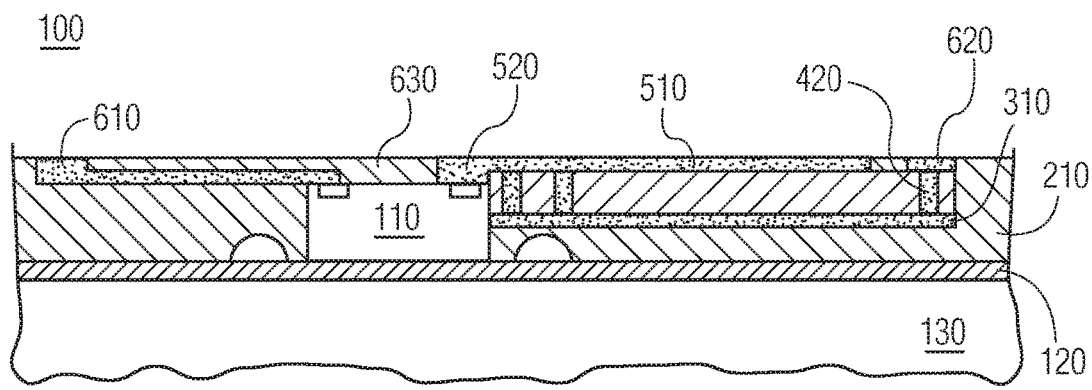
FIG. 10 is a simplified block diagram illustrating a cross-section view of the semiconductor device package structure at a stage in the example processing subsequent to that of FIG. 8, according to one embodiment of the present invention.
Figure 11:
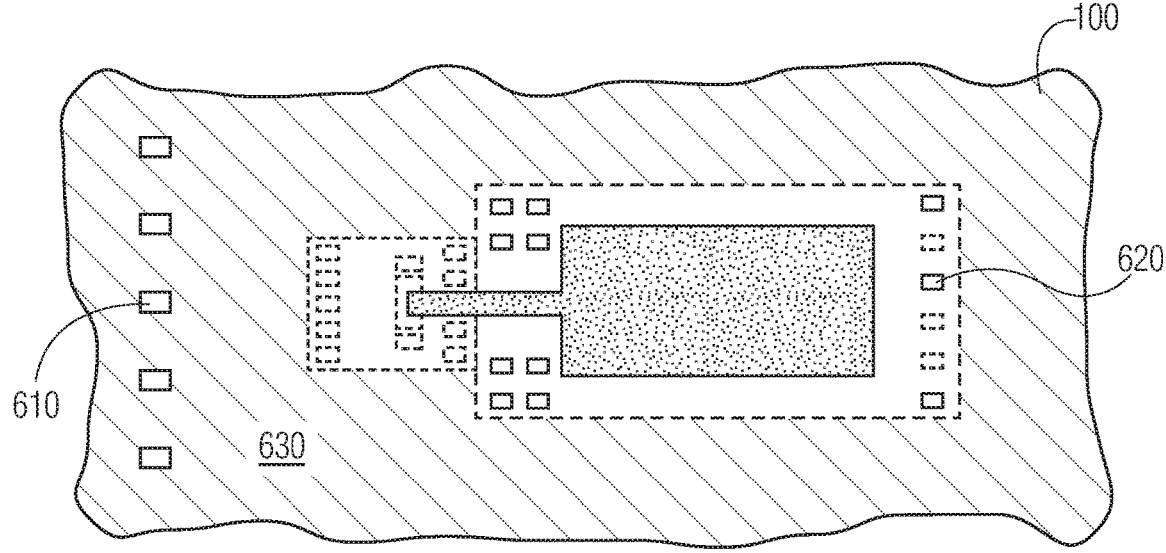
FIG. 11 is a simplified block diagram illustrating a plan view of the semiconductor device package structure at the same stage of processing as that of FIG. 10.

FIG. 10 is a simplified block diagram illustrating a cross-section view of semiconductor device package structure 100 at a stage in the example processing subsequent to that of FIG. 8, according to one embodiment of the present invention. FIG. 11 is a simplified block diagram illustrating a plan view of semiconductor device package structure 100 at the same stage of processing as that of FIG. 10. Additional conductive layers 610 and 620 are formed using additive manufacturing techniques. These additional conductive layers can provide redistribution of signal pads on semiconductor device die 110 for external communication or communication between components of semiconductor device package structure 100. In addition, a dielectric layer 630 is formed over semiconductor device die 110, additional conductive layers 610 and 620, and first dielectric layer 210 to form a final surface of the semiconductor device package structure. Third dielectric layer 630 can be the same or different from the dielectric material used to form first dielectric layer 210 or second dielectric layer 410.

Figure 12:
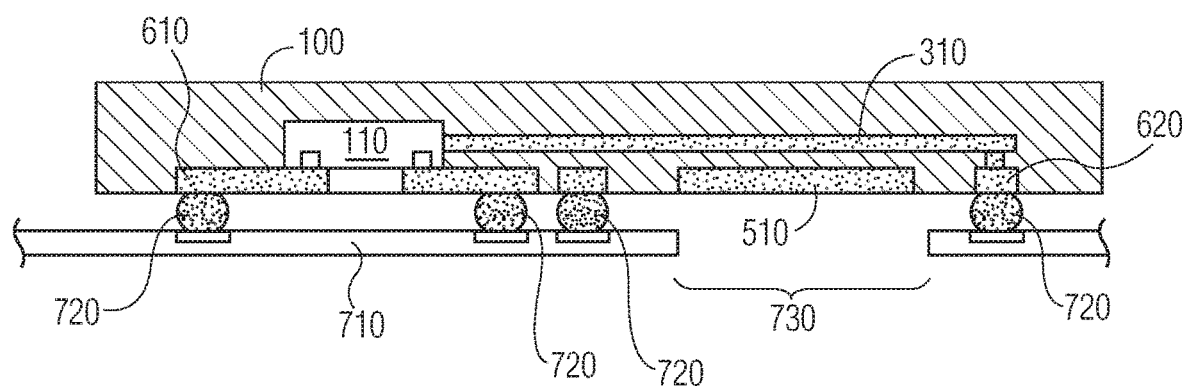
FIG. 12 is a simplified block diagram illustrating a cross-section view of the semiconductor device package structure at a final stage in one example of processing subsequent to that of FIG. 10, according to one embodiment of the present invention.

FIG. 12 is a simplified block diagram illustrating a cross-section view of semiconductor device package structure 100 at a final stage in one example of processing subsequent to that of FIG. 10, according to one embodiment of the present invention. FIG. 12 illustrates an example of semiconductor device package structure 100 after singulation of the semiconductor device package from the printing inclusive carrier and process carrier. Conductors 720 (e.g., conductive solder balls) are attached to redistribution pads formed by conductive layers 610 and 620 and are used to electrically couple the semiconductor device package to a PCB board 710 for use in the desired application. An opening 730 can be provided in PCB board 710 in the region of antenna patch 510 so that radio signals can pass without being impeded by the material of PCB board 710. As illustrated in FIG. 12, semiconductor device package structure 100 is flipped as compared to in previous illustrations.

As discussed above, one advantage of the embodiment illustrated in FIG. 10 is that ground plane 310 is formed within the semiconductor device package structure and therefore the overall thickness of the finished semiconductor device package is significantly less than that of prior art devices. In addition, another advantage is that the ground plane is in contact with the semiconductor device die to provide short connection paths between semiconductor device die 110 and the ground plane and antenna patch. This allows for a package to be provided that can be used in applications requiring small form factor and high-frequency. But techniques of the present invention can be used to provide antenna-incorporating package structures that are advantageous for other applications.

Figure 13:
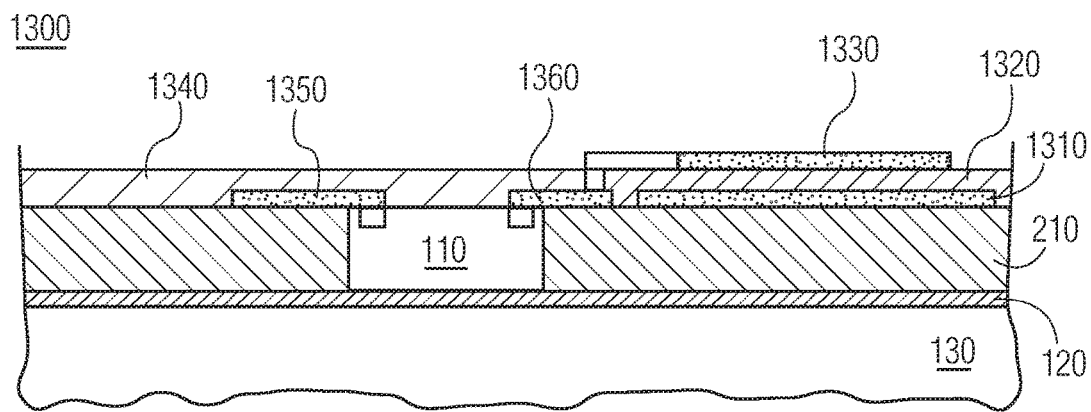
FIG. 13 is a simplified block diagram illustrating a cross-section view of a semiconductor device package structure, according to another embodiment of the present invention.

FIG. 13 is a simplified block diagram illustrating a cross-section view of a semiconductor device package structure 1300, according to another embodiment of the present invention. If thickness of the semiconductor device package is not critical, then the ground plane and antenna patch can be formed above semiconductor device die 110 along with the redistribution layers. As with FIG. 10, semiconductor device die 110 is attached to a process carrier 130 using inclusive carrier 120. In this case, first dielectric layer 210 is printed or otherwise formed to a thickness about the same as a height of semiconductor device die 110. Ground plane 1310 is then formed using additive manufacturing techniques on first dielectric layer 210. Redistribution traces 1350 and 1360 can also be formed on first dielectric layer 210 and over semiconductor device die 110. A second dielectric layer 1320, similar to second dielectric layer 410 discussed above, can be formed using additive manufacturing techniques above and in contact with ground plane 1310. As with the embodiment illustrated in FIG. 10, second dielectric layer 1320 is formed to cover ground plane 1310 of an appropriate material to the application. Similarly, a third dielectric layer 1340 is formed using additive manufacturing techniques in other regions above the semiconductor device package structure. Antenna patch 1330 is formed above and in contact with second dielectric layer 1320, and is of a shape and size appropriate to the application. Antenna patch 1330 can be coupled to a signal pad of semiconductor device die 110 by a conductive via through either the second or third dielectric layer, along with any necessary conductive traces. A semiconductor device package similar to that of FIG. 13 is advantageous for applications in which an area of the semiconductor device package is critical. In such applications, the antenna structure can be formed over the semiconductor device die by providing an appropriate layering of dielectric materials, the ground plane (over the semiconductor device die), and conductors with vias.

Figure 14:
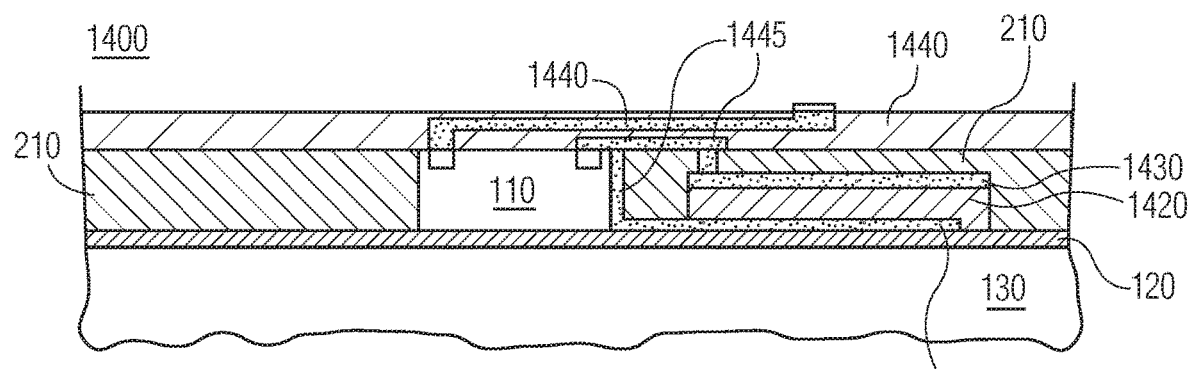
FIG. 14 is a simplified block diagram illustrating a cross-section view of a semiconductor device package structure, according to another embodiment of the present invention.

FIG. 14 is a simplified block diagram illustrating a cross-section view of a semiconductor device package structure 1400, according to another embodiment of the present invention. In certain applications, a geometry in which the antenna patch is on an opposite side of the semiconductor device package from that illustrated in FIG. 10 may be desirable. Semiconductor device package structure 1400 provides an antenna patch formed on the inclusive carrier to allow for such a geometry. As with FIG. 10, semiconductor device die 110 is attached to a process carrier 130 using printing inclusive carrier 120. Using additive manufacturing techniques, an antenna patch 1410 is formed from conductive materials in a desired location on printing inclusive carrier 120. The antenna patch can be electrically coupled to an appropriate signal pad on semiconductor device die 110 using one or more conductive vias 1415 printed during formation of first dielectric layer 210 around semiconductor device die 110. In addition, a second dielectric layer 1420 can be formed using additive manufacturing techniques above and in contact with antenna patch 1410. As with the previously discussed antenna structures, the composition and thickness of second dielectric layer 1420 is dependent upon the nature of the applications intended for the antenna structure. Subsequent to formation of the second dielectric layer, a ground plane 1430 is formed above and in contact with the second dielectric layer using additive manufacturing techniques of a conductive material appropriate to the application. As illustrated, first dielectric layer 210 is formed to cover ground plane 1430 and the rest of the semiconductor device package structure to a thickness equal to the height of semiconductor device die 110. Conductive traces for redistribution of signals 1445 and 1450 can then be formed using additive manufacturing techniques, along with a third dielectric layer 1440.

Figure 15:
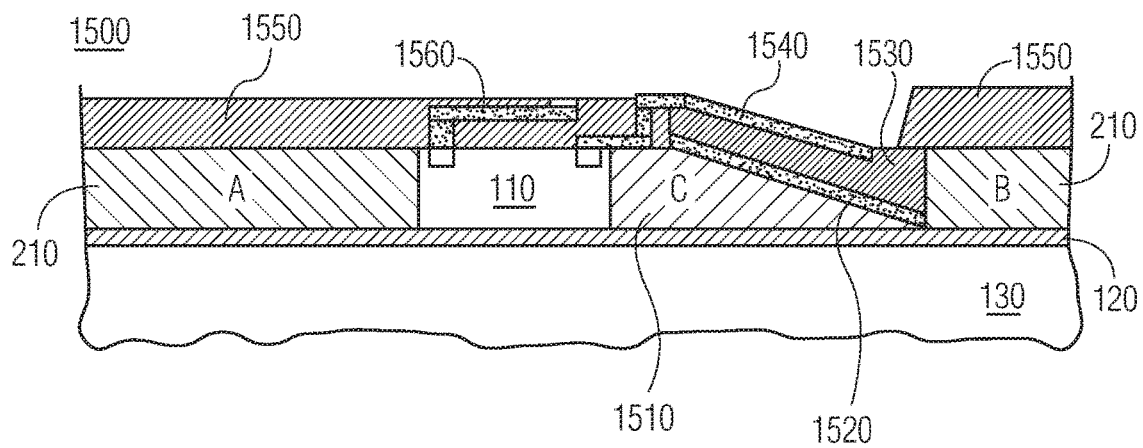
FIG. 15 is a simplified block diagram illustrating a cross-section view of a semiconductor device package structure, according to another embodiment of the present invention.

FIG. 15 is a simplified block diagram illustrating a cross-section view of a semiconductor device package structure 1500, according to another embodiment of the present invention. For some applications, antenna orientation that is not planar with the major surface of the semiconductor device package structure can be desirable. For example, in certain applications it can be important to avoid blind spots in desired coverage areas and installed orientation of the semiconductor device package is not flexible. Thus, forming a patch antenna that is at an angle to the major surfaces of semiconductor device package may be useful for the application. Traditional methods of providing antennas in semiconductor device packages cannot produce such an angled antenna. But additive manufacturing techniques can provide such antennas because of the use of three-dimensional design and process control.

As provided in the previous figures, the semiconductor device die 110 is affixed to a process carrier 130 using a printing inclusive carrier 120. First dielectric layer 210 is formed in Regions A and B to a thickness of about a height of semiconductor device die 110. In Region C, material of first dielectric region 1510 is formed, using additive manufacturing techniques, to provide an angled surface for formation of the antenna structure. The angle of the surface is equivalent to that desired for the to-be-formed antenna patch. Formation of Region C can be done at the same time Regions A and B are formed, using the same or different dielectric material. Subsequently, a ground plane 1520 is formed over and in contact with the angled surface of region C. A second dielectric material 1530 can then be formed over and in contact with ground plane 1520. As with previously discussed second dielectric material regions, the thickness and properties of the second dielectric material are chosen for the application of the antenna structure. Additive manufacturing techniques allow for the angular formation of these layers to a desired thickness and parallel surfaces within the angled Region C. Antenna patch 1540 is then formed over and in contact with a portion of second dielectric material 1530, also at an angle. A third dielectric material 1550 can be applied over Regions A and B, along with appropriate conductors (e.g. 1560) for redistribution and signal communication with the antenna patch and ground plane. Third dielectric material 1550 may need to be formed in such a way as to avoid interfering with electromagnetic communication with antenna patch 1540 during use.

By now it should be appreciated that there has been provided a semiconductor device package that includes a semiconductor device die, having an active side and a back side opposite the active side, and an antenna structure. The antenna structure includes a ground plane formed of a conductive layer on a first layer of a first dielectric material and a second layer of a second dielectric material formed over and in contact with the ground plane. The back side of the semiconductor device die defines a first plane, the first layer of dielectric material is formed on and above the first plane, and at least a portion of the first layer of dielectric material beneath the ground plane has a thickness less than a height of the semiconductor device die.

In one aspect of the above embodiment the antenna structure further includes an antenna patch including a metal layer formed over and in contact with a part of the second layer of the second dielectric material. In a further aspect, the antenna structure further includes at least one trace between the antenna patch and a signal pad of the semiconductor device die. In another further aspect, a thickness of the second layer of the second dielectric material is configured for a desired antenna bandwidth. In yet another further aspect, the second dielectric material includes a dielectric constant configured for a desired antenna frequency.

In another aspect of the above embodiment, the ground plane is formed in contact with a lateral side surface of the semiconductor device die, where the lateral side surface is perpendicular to the active and back sides. In a further aspect, the semiconductor device package also includes one or more metal filled vias formed through the second layer of second dielectric material electrically coupling the ground plane with one or more signal paths of the semiconductor device die.

In another aspect of the above embodiment, a bottom surface of the ground plane defines a second plane, and the second plane is parallel to the first plane. In yet another aspect of the above embodiment, a bottom surface of the ground plane defines a second plane, and the second plane is at an angle to the first plane. In still another aspect of the above embodiment, the first dielectric material and the second dielectric material have different dielectric constants. In another aspect of the above embodiment, the first layer of first dielectric material, second layer of second dielectric material, and ground plane are formed using additive manufacturing techniques.

Another embodiment of the present invention provides a semiconductor device package that includes a semiconductor device die having an active side and a back side, and antenna structure. The active side of the semiconductor device die defines a first plane and the back side defines a second plane. The antenna structure includes a ground plane formed of a conductive layer on a first layer of a first dielectric material where the ground plane is formed within a space lateral to the semiconductor device die between the first and second planes.

In one aspect of the above embodiment, the antenna structure further includes a second layer of second dielectric material formed over and in contact with the ground plane, and antenna patch including a metal layer formed over and in contact with at least a part of the second layer of second dielectric material, and over at least a part of the ground plane. In a further aspect, the antenna structure further includes one or more metal-filled vias through the second layer of second dielectric material and coupling the antenna patch to a signal pad on the device die. In another further aspect, the antenna patch includes a portion of the metal layer electrically coupled to a signal pad on the device die. In yet another aspect, a thickness of the second layer of the second dielectric material is configured for a desired antenna bandwidth. In still another aspect, the second dielectric material includes a dielectric constant configured for a desired antenna frequency.

In another aspect of the above embodiment, the major surface of the semiconductor device package defines a first plane, a surface plane of the first layer of first dielectric material in a region under the ground plane defines a second plane, and the second plane is parallel to the first plane. In another aspect of the above embodiment, the major surface of the semiconductor device package defines a first plane, a surface plane of the first layer of first dielectric material in a region under the ground plane defines a second plane, and the second plane is at an angle to the first plane. In yet another aspect of the above embodiment, the first layer of first dielectric material, second layer of second dielectric material, ground plane, and antenna patch are formed using additive manufacturing techniques. In still another aspect, at least a portion of an edge of the ground plane is in contact with a minor surface of the semiconductor device die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a semiconductor device die comprising an active side and a back side opposite the active side, wherein the active side comprises a plurality of signal pads, wherein the active side is located above the back side with respect to a first package orientation; and
   an antenna structure comprising
      a ground plane formed of a conductive layer on a first layer of a first dielectric material, wherein
         the back side of the semiconductor device die defines a first plane,
         the first layer of the first dielectric material is formed laterally adjacent to the semiconductor device die,
         a bottom surface of the first layer of the first dielectric material is planar with the back side of the semiconductor device die, and
         at least a portion of the first layer of the first dielectric material beneath, with respect to the first package orientation, the ground plane has a thickness less than a height of the semiconductor device die, and
      a second layer of a second dielectric material formed over and in contact with the ground plane.

2. The semiconductor device package of claim 1 wherein the antenna structure further comprises:
   an antenna patch comprising a metal layer formed over and in contact with a part of the second layer of the second dielectric material.

3. The semiconductor device package of claim 2 wherein the antenna structure further comprises at least one trace coupling the antenna patch and a signal pad of the semiconductor device die.

4. The semiconductor device package of claim 2 wherein a thickness of the second layer of the second dielectric material is configured for a desired antenna bandwidth.

5. The semiconductor device package of claim 2 wherein the second dielectric material comprises a dielectric constant configured for a desired antenna frequency.

6. The semiconductor device package of claim 1 wherein the ground plane is formed in contact with a side surface of the semiconductor device die.

7. The semiconductor device package of claim 6 further comprising:

one or more traces electrically coupled to one or more corresponding signal pads of the semiconductor device die; and one or more metal filled vias formed through the second layer of second dielectric material electrically coupling the ground plane with the one or more traces.

8. The semiconductor device package of claim 1, wherein a bottom surface of the ground plane defines a second plane; and the second plane is parallel to the first plane.

9. The semiconductor device package of claim 1 wherein the first dielectric material and the second dielectric material have different dielectric constants.

10. The semiconductor device package of claim 1 wherein the first layer of first dielectric material, second layer of second dielectric material, and ground plane are formed using additive manufacturing techniques.

11. A semiconductor device package comprising:

a semiconductor device die having an active side that defines a first plane, and a back side that defines a second plane; and an antenna structure comprising a ground plane formed of a conductive layer on a first layer of a first dielectric material, wherein the ground plane is formed within a space lateral to the semiconductor device die between the first and second planes.

12. The semiconductor device package of claim 11 wherein the antenna structure further comprises:

a second layer of second dielectric material formed over and in contact with the ground plane; and an antenna patch comprising a metal layer formed over and in contact with at least a part of the second layer of second dielectric material, and over at least a part of the ground plane.

13. The semiconductor device package of claim 12 wherein the antenna patch comprises a portion of the metal layer electrically coupled to a signal pad on the device die.

14. The semiconductor device package of claim 12, wherein a thickness of the second layer of the second dielectric material is configured for a desired antenna bandwidth; and the second dielectric material comprises a dielectric constant configured for a desired antenna frequency.

15. The semiconductor device package of claim 11, wherein a surface plane of the first layer of first dielectric material in a region under the ground plane defines a third plane; and the third plane is parallel to the first plane.

16. The semiconductor device package of claim 11 wherein at least a portion of an edge of the ground plane is in contact with a minor surface of the semiconductor device die.

* * * * *